(12) United States Patent
Ochimizu et al.

(10) Patent No.: US 8,836,126 B2
(45) Date of Patent: Sep. 16, 2014

(54) SEMICONDUCTOR DEVICE HAVING INSULATING LAYERS CONTAINING OXYGEN AND A BARRIER LAYER CONTAINING MANGANESE

(75) Inventors: Hirosato Ochimizu, Kawasaki (JP);
Atsuhiro Tsukune, Kawasaki (JP);
Hiroshi Kudo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 184 days.

(21) Appl. No.: 12/535,489

(22) Filed: Aug. 4, 2009

(65) Prior Publication Data
US 2010/0038792 A1 Feb. 18, 2010

(30) Foreign Application Priority Data
Aug. 15, 2008 (JP) ................. 2008-209121

(51) Int. Cl.
| | |
|---|---|
| H01L 23/48 | (2006.01) |
| H01L 23/52 | (2006.01) |
| H01L 29/40 | (2006.01) |
| H01L 23/532 | (2006.01) |
| H01L 21/768 | (2006.01) |
| H01L 23/528 | (2006.01) |

(52) U.S. Cl.
CPC .... *H01L 23/53295* (2013.01); *H01L 23/53238* (2013.01); *H01L 21/76867* (2013.01); *H01L 21/76831* (2013.01); *H01L 21/76873* (2013.01); *H01L 21/76864* (2013.01); *H01L 21/76807* (2013.01); *H01L 21/76843* (2013.01); *H01L 23/528* (2013.01); *H01L 23/5329* (2013.01)

USPC .......... 257/758; 257/741; 257/750; 257/762; 257/774; 257/775

(58) Field of Classification Search
CPC ............ H01L 23/528; H01L 21/76867; H01L 21/76873; H01L 21/76843; H01L 21/76831; H01L 23/5329; H01L 23/53238; H01L 21/76864; H01L 21/76807; H01L 23/53295
USPC .................. 257/758, 762, 774, 741, 750, 775
See application file for complete search history.

(56) References Cited

U.S. PATENT DOCUMENTS

| | | | | |
|---|---|---|---|---|
| 6,265,779 | B1 * | 7/2001 | Grill et al. ..................... | 257/759 |
| 7,067,919 | B2 | 6/2006 | Watanabe et al. | |
| 8,102,051 | B2 * | 1/2012 | Nakao ........................... | 257/751 |

(Continued)

FOREIGN PATENT DOCUMENTS

| | | |
|---|---|---|
| JP | 2001-156071 A | 6/2001 |
| JP | 2002-033384 A | 1/2002 |

(Continued)

OTHER PUBLICATIONS

Japanese Office Action mailed on May 14, 2013 for corresponding Japanese Application No. 2008-209121.

*Primary Examiner* — Teresa M Arroyo
(74) *Attorney, Agent, or Firm* — Fujitsu Patent Center

(57) ABSTRACT

A semiconductor device includes an insulating layer formed over a semiconductor substrate, the insulating layer including oxygen, a first wire formed in the insulating layer, and a second wire formed in the insulating layer over the first wire and containing manganese, oxygen, and copper, the second wire having a projection portion formed in the insulating layer and extending downwardly but spaced apart from the first wire.

3 Claims, 7 Drawing Sheets

(56) References Cited

U.S. PATENT DOCUMENTS

| | | | |
|---|---|---|---|
| 2001/0022398 A1* | 9/2001 | Grill et al. | 257/758 |
| 2002/0171100 A1* | 11/2002 | Pohm | 257/310 |
| 2005/0218519 A1* | 10/2005 | Koike et al. | 257/756 |
| 2006/0226457 A1* | 10/2006 | Abe | 257/295 |
| 2007/0012973 A1* | 1/2007 | Nasu et al. | 257/295 |
| 2007/0173055 A1* | 7/2007 | Ohtsuka et al. | 438/627 |
| 2008/0054467 A1* | 3/2008 | Ohba et al. | 257/751 |
| 2008/0237866 A1* | 10/2008 | Wang | 257/753 |
| 2009/0146309 A1* | 6/2009 | Kudo et al. | 257/768 |
| 2009/0267198 A1* | 10/2009 | Tada et al. | 257/635 |
| 2010/0025852 A1* | 2/2010 | Ueki et al. | 257/761 |
| 2010/0117232 A1* | 5/2010 | Nakao | 257/751 |
| 2012/0013023 A1* | 1/2012 | Tada et al. | 257/774 |

FOREIGN PATENT DOCUMENTS

| | | | |
|---|---|---|---|
| JP | 3790469 B | | 4/2006 |
| JP | 2007-59660 A | | 3/2007 |
| JP | 2007287816 A | * | 11/2007 |
| JP | 2008-047578 A | | 2/2008 |
| WO | WO 2007/064471 A1 | | 6/2007 |

* cited by examiner

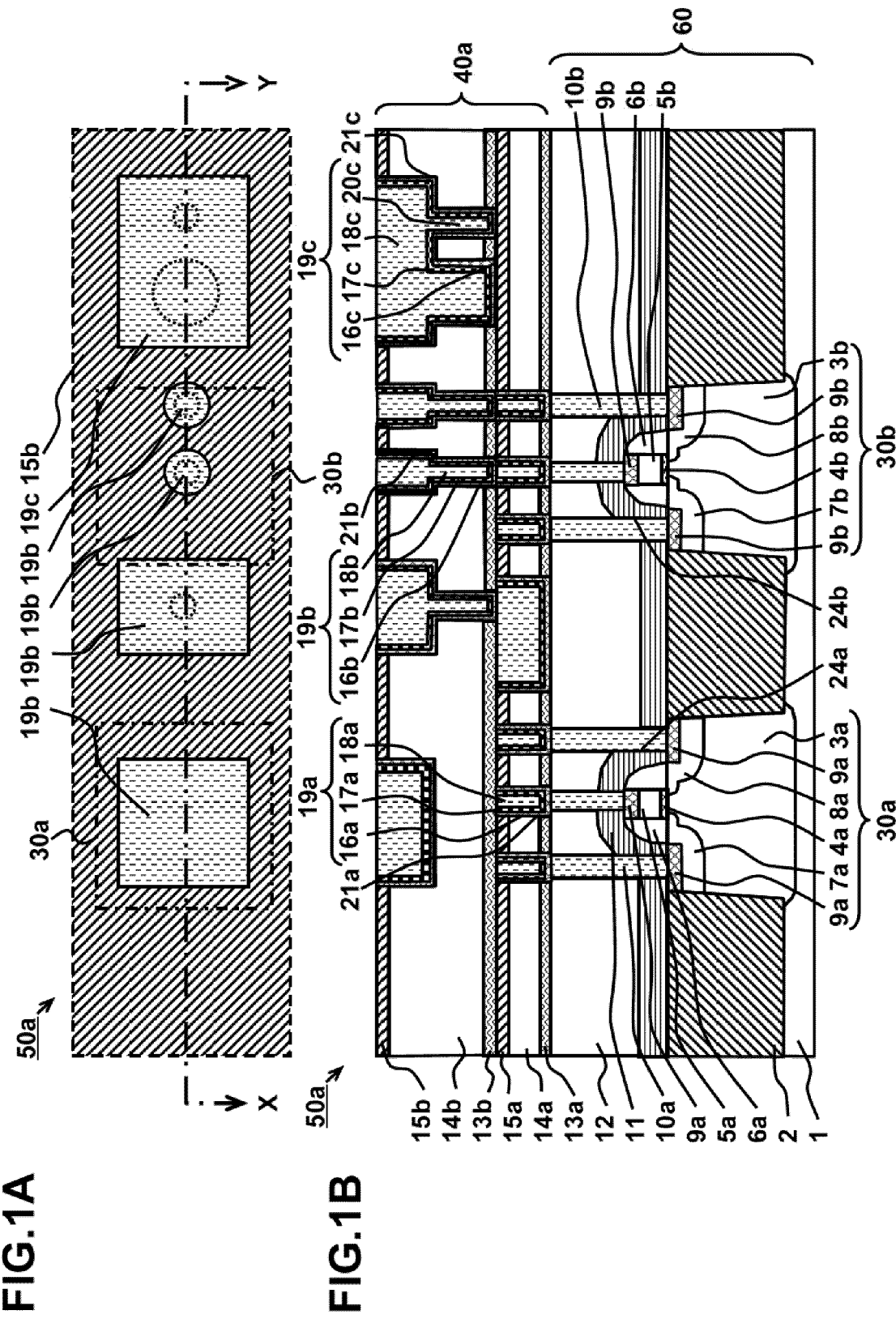

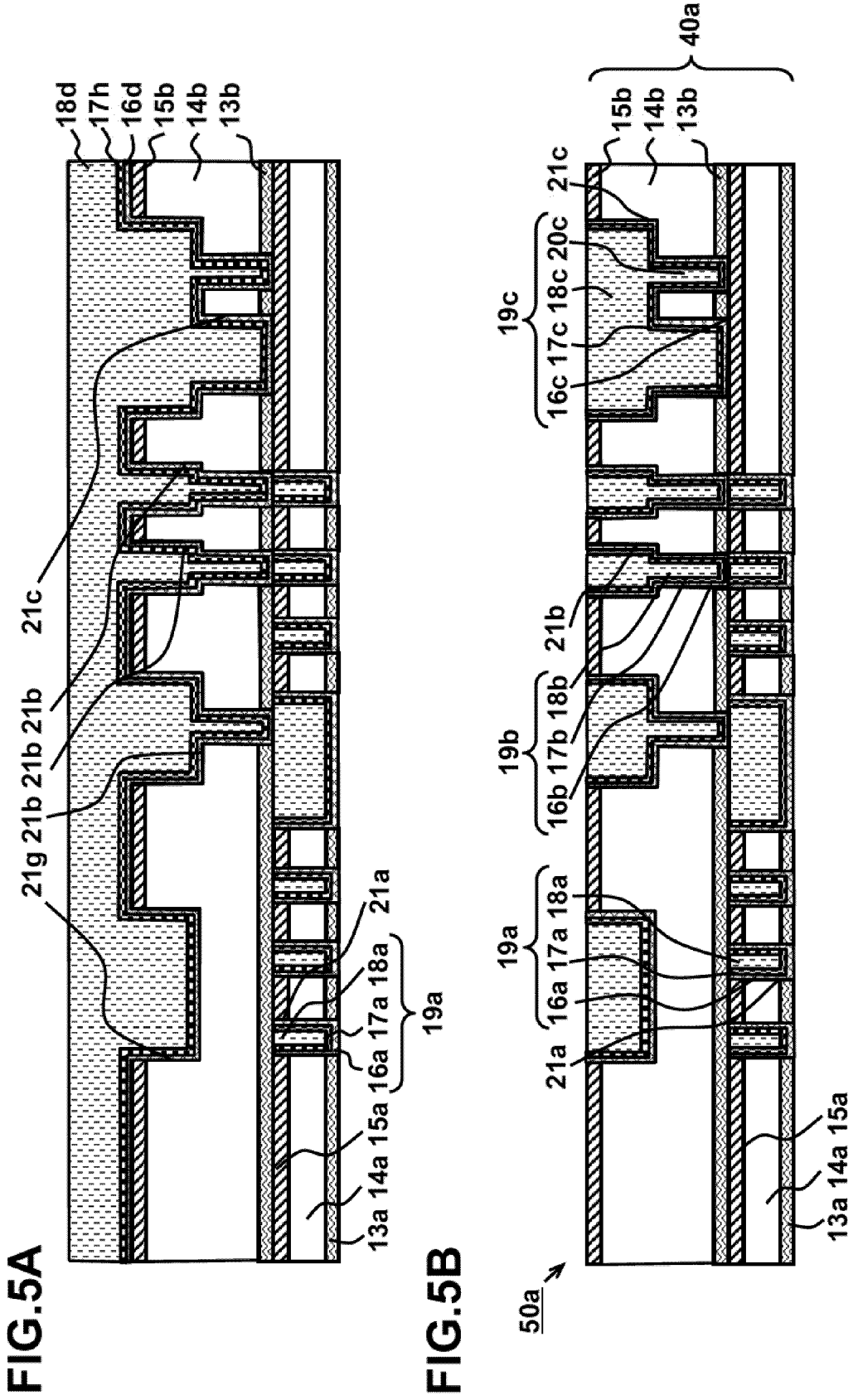

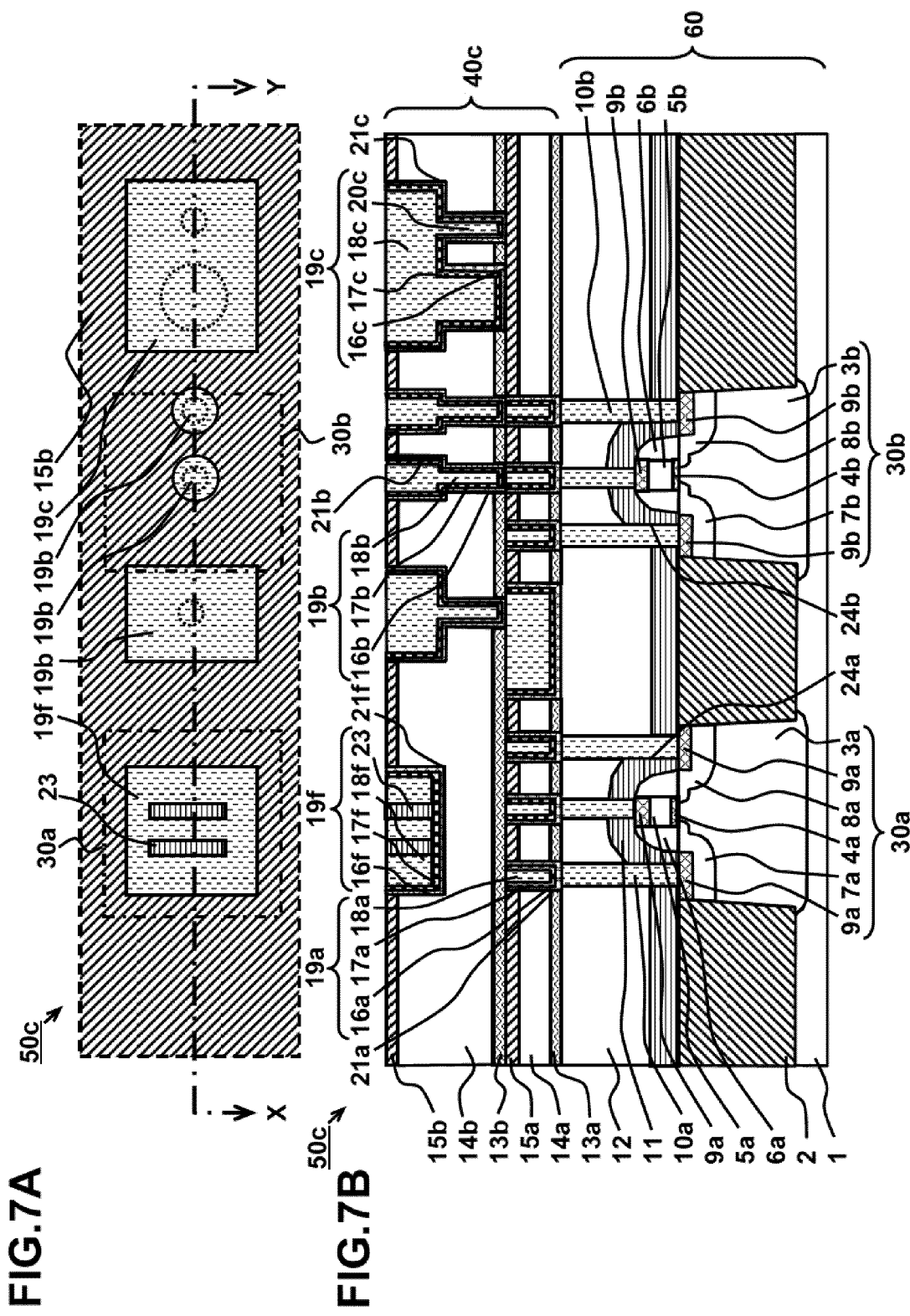

US 8,836,126 B2

SEMICONDUCTOR DEVICE HAVING INSULATING LAYERS CONTAINING OXYGEN AND A BARRIER LAYER CONTAINING MANGANESE

CROSS-REFERENCE TO RELATED APPLICATION

This application is based upon and claims the benefit of priority of the prior Japanese Patent Application No. 2008-209121 filed on Aug. 15, 2008, the entire contents of which are incorporated herein by reference.

FIELD

An aspect of the embodiments discussed herein is directed to a semiconductor device having a multilayer interconnection structure.

BACKGROUND

In current semiconductor integrated circuit devices, a multilayer interconnection structure has been used to interconnect among semiconductor elements. In ultrafine and ultra high-speed semiconductor devices, in order to reduce the problem of signal delay (RC delay), a low-resistance copper (Cu) pattern is used as a wiring pattern.

In order to form a cupper wire, a so-called damascene method or dual-damascene method has been used. The damascene method is a method of forming a wire in which a Cu layer is buried in a wire groove or a via hole formed in an interlayer insulating layer using chemical mechanical polishing (CMP).

When the Cu wire is formed, a diffusion-reducing barrier is formed to reduce the diffusion of Cu atoms into an interlayer insulating layer. For the diffusion-reducing barrier, in general, refractory metals, such as tantalum (Ta), titanium (Ti), and tungsten (W), and conductive nitrides of the above refractory metals have been used.

However, the above materials have a higher resistivity than that of Cu; hence, in order to further decrease the wiring resistance, the thickness of the diffusion-reducing barrier may be decreased as small as possible. Accordingly, Japanese Laid-open Patent Publication No. 2007-59660 discusses a technique that a Cu—Mn alloy is used instead of the diffusion-reducing barrier. The reason for this is that $MnSi_xO_y$ is formed in a self-alignment manner at the interface between an interlayer insulating layer and a Cu wire by a reaction of Mn with $O_2$ and Si, which are contained in the interlayer insulating layer, and that Mn oxides function as a diffusion-reducing layer. However, at the interface between the interlayer insulating layer and the Cu wire, when Mn which is not allowed to react with $O_2$ contained in the interlayer insulating layer dissolves in the Cu wire, the resistance of the Cu wire may increase.

SUMMARY

According to an aspect of an embodiment, a semiconductor device includes an insulating layer formed over a semiconductor substrate, the insulating layer including oxygen, a first wire formed in the insulating layer, and a second wire formed in the insulating layer over the first wire and containing manganese, oxygen, and copper, the second wire having a projection portion formed in the insulating layer and extending downwardly but spaced apart from the first wire.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1A is a plan view illustrating the structure of a semiconductor device 50a according to a first embodiment;

FIG. 1B is a cross-sectional view of the semiconductor device 50a taken along the line X-Y illustrated in FIG. 1A;

FIGS. 5A-5B are views each illustrating the method of manufacturing the semiconductor device 50a according to the first embodiment;

FIG. 7A is a plan view illustrating the structure of a semiconductor device 50c according to a third embodiment; and FIG. 7B is a cross-sectional view of the semiconductor device 50c taken along the line X-Y illustrated in FIG. 7A.

DESCRIPTION OF EMBODIMENTS

Figure 2A:
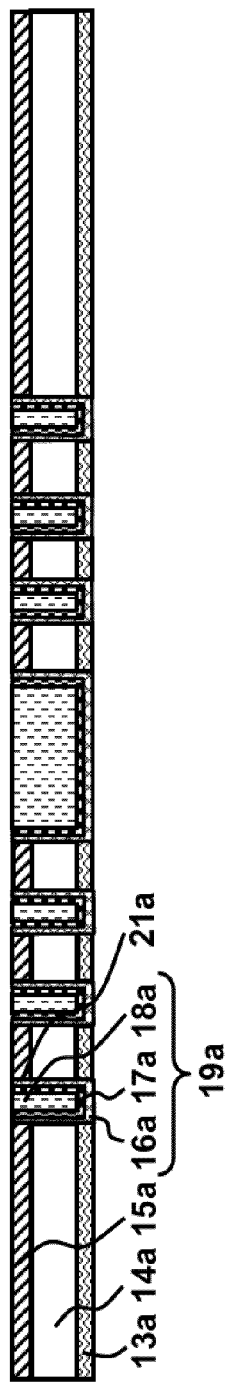
FIGS. 2A-2B are views each illustrating a method of manufacturing the semiconductor device 50a according to the first embodiment.

Hereinafter, a first embodiment, a second embodiment, and a third embodiment will be described. However, the present technique is not limited to the embodiments mentioned above.

In the first embodiment, FIGS. 1A to 6B are views illustrating a semiconductor device 50a and a method of manufacturing the same in detail.

According to the structure of the semiconductor device 50a of the first embodiment and to the method of manufacturing the same, a contact area between an insulating layer containing oxygen and a second barrier layer containing Mn may be increased. Hence, Mn may be sufficiently consumed by the formation of Mn oxides at a portion at which the contact area between the insulating layer and the second barrier layer is increased, and an increase in resistance of a copper wire may be reduced.

FIGS. 1A and 1B each illustrate the structure of the semiconductor device 50a of the first embodiment. FIG. 1A is a plan view of the semiconductor device 50a. FIG. 1B is a cross-sectional view taken along the line X-Y illustrated in FIG. 1A.

In the semiconductor device 50a of the first embodiment illustrated in FIG. 1A, a fourth interlayer insulating layer is represented by reference numeral 15b, second wires (Cu wire) are each represented by reference numeral 19b, and a third wire is represented by reference numeral 19c. The fourth interlayer insulating layer 15b is formed so as to cover an n-type MOS transistor forming region 30a and a p-type MOS transistor forming region 30b. The fourth interlayer insulating layer 15b is preferably formed of $SiO_2$. As a material forming the interlayer insulating layer 15b, a material is preferably used which has a higher resistance against chemical mechanical polishing (CMP) than that of a third interlayer insulating layer 14b which will be described later.

The second wires 19b are formed so as to be partly overlapped with the n-type MOS transistor forming the region 30a and the p-type MOS transistor forming the region 30b. The second wires 19b each have an approximately rectangular shape or an approximately circular shape. The second wires 19b are each preferably formed so as to be electrically connected to the n-type MOS transistor forming the region 30a and the p-type MOS transistor forming the region 30b. The second wires 19b are preferably formed of copper (Cu) which has a low resistivity.

The third wire 19c is formed in the vicinity of the p-type MOS transistor forming the region 30b. The third wire 19c has an approximately rectangular shape. The third wire 19c is not electrically connected to the n-type MOS transistor forming the region 30a and the p-type MOS transistor forming the region 30b. The third wire 19c is preferably formed of Cu which has a low resistivity.

In FIG. 1B, the semiconductor device 50a according to the first embodiment includes a transistor forming layer 60 and a multilayer interconnection structure 40a. The transistor forming layer 60 has the n-type MOS transistor forming the region 30a and the p-type MOS transistor forming the region 30b. The multilayer interconnection structure 40a has first wires 19a, the second wires 19b, and the third wire 19c. In addition, in FIG. 1B, constituents similar to those described with reference to FIG. 1A are designated by the same reference numerals.

As illustrated in FIG. 1B, a silicon substrate 1 has an n-type conductivity. An element isolation region 2 has a shallow trench isolation structure. The n-type MOS transistor forming region 30a and the p-type MOS transistor forming region 30b are defined by the element isolation region 2.

In the n-type MOS transistor forming region 30a, a p-type well region is represented by reference numeral 3a, a gate insulating film is represented by reference numeral 4a, a gate electrode is represented by reference numeral 5a, a source region is represented by reference numeral 7a, a drain region is represented by reference numeral 8a, and a silicide layer is represented by reference numeral 9a.

The p-type well region 3a is formed by performing ion-implantation of a p-type impurity in the silicon substrate 1. The gate insulating film 4a is formed on the silicon substrate 1 in the p-type well region 3a. The gate electrode 5a is formed on the silicon substrate 1 with the gate insulating film 4a interposed therebetween. Sidewalls 6a are formed on side walls of the gate electrode 5a. The sidewalls 6a may be formed using silicon oxide (SiO$_2$) which is an insulating material. The source region 7a and the drain region 8a are formed in the p-type well region 3a of the silicon substrate 1. The silicide layers 9a are provided on the gate electrode 5a and in the surface of the silicon substrate 1 in the source region 7a and the drain region 8a.

In the p-type MOS transistor forming region 30b, an n-type well region is represented by reference numeral 3b, a gate insulating film is represented by reference numeral 4b, a gate electrode is represented by reference numeral 5b, a source region is represented by reference numeral 7b, a drain region is represented by reference numeral 8b, and a silicide layer is represented by reference numeral 9b.

The n-type well region 3b is formed by performing ion-implantation of an n-type impurity in the silicon substrate 1. The gate oxide film 4b is formed on the silicon substrate 1 in the n-type well region 3b. The gate electrode 5b is formed on the silicon substrate 1 with the gate oxide film 4b interposed therebetween. Sidewalls 6b are formed on side walls of the gate electrode 5b. The sidewalls 6b may be formed using silicon oxide (SiO$_2$) which is an insulating material. The source region 7b and the drain region 8b are formed in the n-type well region 3b of the silicon substrate 1. The silicide layers 9b are provided on the gate electrode 5b and in the surface of the silicon substrate 1 in the source region 7b and the drain region 8b.

A protective layer 11 is formed so as to cover the silicon substrate 1, that is, so as to cover the n-type MOS transistor forming region 30a and the p-type MOS transistor forming region 30b on the silicon substrate 1. The protective layer 11 is preferably formed, for example, of silicon nitride (SiN). The protective layer 11 is formed to protect the n-type MOS transistor forming region 30a and the p-type MOS transistor forming region 30b.

A first interlayer insulating layer 12 is formed on the protective layer 11. The first interlayer insulating layer 12 is preferably formed, for example, of silicon oxide (SiO$_2$). The first interlayer insulating layer 12 is formed to ensure the insulation between the n-type MOS transistor forming region 30a and the p-type MOS transistor forming region 30b.

Openings 24a are formed to penetrate the protective layer 11 and the first interlayer insulating layer 12 so that conductive materials to be filled in the openings 24a are electrically connected to the gate electrode 5a, the source region 7a, and the drain region 8a of the n-type MOS transistor forming region 30a. Openings 24b are formed to penetrate the protective layer 11 and the first interlayer insulating layer 12 so that conductive materials to be filled in the openings 24b are electrically connected to the gate electrode 5b, the source region 7b, and the drain region 8b of the p-type MOS transistor forming region 30b.

A wire 10a is formed by burying a conductive material in each opening 24a. A wire 10b is formed by burying a conductive material in each opening 24b. The conductive materials are each preferably formed, for example, of copper (Cu). In addition, the wire 10a and the corresponding opening 24a are collectively called a contact via, and the wire 10b and the corresponding opening 24b are also collectively called a contact via.

In the multilayer interconnection structure 40a, a second interlayer insulating layer is represented by reference numeral 13a, a third interlayer insulating layer is represented by reference numeral 14a, a fourth interlayer insulating layer is represented by reference numeral 15a, a second interlayer insulating layer is represented by reference numeral 13b, a third interlayer insulating layer is represented by reference numeral 14b, a fourth interlayer insulating layer is represented by reference numeral 15b, a first barrier layer is represented by reference numeral 16a, a second barrier layer is represented by reference numeral 17a, a conductive layer is represented by reference numeral 18a, the first wire is represented by reference numeral 19a, a first barrier layer is represented by reference numeral 16b, a second barrier layer is represented by reference numeral 17b, a conductive layer is represented by reference numeral 18b, the second wire is represented by reference numeral 19b, a first barrier layer is represented by reference numeral 16c, a second barrier layer is represented by reference numeral 17c, a conductive layer is represented by reference numeral 18c, the third wire is represented by reference numeral 19c, a dummy plug is represented by reference numeral 20c, and openings are represented by reference numerals 21a, 21b, and 21c.

The second interlayer insulating layer 13a is formed on the first interlayer insulating layer 12. The second interlayer insulating layer 13a is preferably formed, for example, of silicon carbide (SiC). The second interlayer insulating layer 13a preferably has a thickness of 15 nm to 30 nm. The second interlayer insulating layer 13a functions as an etching stopper when the openings 21a, which will be described later, are formed.

The third interlayer insulating layer 14a is formed on the second interlayer insulating layer 13a. The third interlayer insulating layer 14a is preferably formed, for example, of a low dielectric-constant material having a relative dielectric constant of 3.2 or less. As the low dielectric-constant material, for example, methylated-hydrogen silsesquoxane (MSQ) having a relative dielectric constant of 2.6, SiLK K or porous SiLK K, which are the registered trade names of Dow Chemical Company, a hydrocarbon-based polymer, or carbon-containing $SiO_2$ (SiOC) may be preferably used. The third interlayer insulating layer 14a is used to reduce the problem of signal delay (RC delay) in the multilayer interconnection structure. The third interlayer insulating layer 14a preferably has a thickness of 100 nm to 300 nm.

The fourth interlayer insulating layer 15a is formed on the third interlayer insulating layer 14a. The fourth interlayer insulating layer 15a is preferably formed, for example, of $SiO_2$. The fourth interlayer insulating layer 15a functions as a protective layer for the third interlayer insulating layer 14a having a low resistance against chemical mechanical polishing (CMP). The fourth interlayer insulating layer 15a preferably has a thickness of 15 nm to 30 nm.

The openings 21a are formed to penetrate the second interlayer insulating layer 13a, the third interlayer insulating layer 14a, and the fourth interlayer insulating layer 15a so that conductive materials to be filled in the openings 21a are electrically connected to the respective wires 10a. The first wire 19a is formed of the conductive layer 18a buried in the opening 21a. The conductive layer 18a is preferably formed, for example, of copper (Cu).

The first barrier layer 16a and the second barrier layer 17a are sequentially provided between the opening 21a and the conductive layer 18a. The first barrier layer 16a is formed at the opening 21a side. The second barrier layer 17a is formed at the conductive layer 18a side.

Since the Cu wire is formed in the opening 21a, a material which reduces Cu diffusion and which has superior adhesion to Cu is used for the first barrier layer 16a. As the material described above, for example, titanium (Ti), titanium nitride (TiN), titanium silicide nitride (TiSiN), tungsten (W), tungsten nitride (WN), tantalum (Ta), or tantalum nitride (TaN) may be used. In addition, the first barrier layer 16a may be formed using a laminate including at least two layers of the above materials. The first barrier layer 16a preferably has a thickness of 3 nm to 10 nm. Incidentally, the first barrier layer 16a may only be formed when it is necessary.

The second barrier layer 17a is formed between the first barrier layer 16a and the conductive layer 18a. Since the third interlayer insulating layer 14a is formed of SiOC, the fourth interlayer insulating layer 15a is formed of $SiO_2$, and Mn also reacts with Si, the composition of Mn-containing oxides forming the second barrier layer 17a is represented by $Mn_xSi_yO_z$ (x:y:z is in the range of 1:1:3 to 1:3:5). In addition, the second barrier layer 17a preferably has a thickness of 1 nm to 5 nm.

The second interlayer insulating layer 13b is formed on the fourth interlayer insulating layer 15a. The second interlayer insulating layer 13b is preferably formed, for example, of silicon carbide (SiC) as with the second interlayer insulating layer 13a. The second interlayer insulating layer 13b preferably has a thickness of 15 nm to 30 nm.

The third interlayer insulating layer 14b is formed on the second interlayer insulating layer 13b. As with the third interlayer insulating layer 14a, the third interlayer insulating layer 14b is preferably formed, for example, of a low dielectric-constant material having a relative dielectric constant of 3.2 or less. The third interlayer insulating layer 14b preferably has a thickness of 100 nm to 300 nm.

The fourth interlayer insulating layer 15b is formed on the third interlayer insulating layer 14b. As with the fourth interlayer insulating layer 15a, the fourth interlayer insulating layer 15b is preferably formed, for example, of $SiO_2$. The fourth interlayer insulating layer 15b functions as a protective layer for the third interlayer insulating layer 14b having a low CMP resistance. The fourth interlayer insulating layer 15b preferably has a thickness of 15 nm to 30 nm.

The openings 21b are formed to penetrate the second interlayer insulating layer 13b, the third interlayer insulating layer 14b, and the fourth interlayer insulating layer 15b so that conductive materials to be filled in the openings 21b are electrically connected to the respective first wires 19a. The second wire 19b is formed of the conductive layer 18b buried in the opening 21b. The conductive layer 18b is preferably formed, for example, of copper (Cu).

The first barrier layer 16b and the second barrier layer 17b are sequentially provided between the opening 21b and the conductive layer 18b. The first barrier layer 16b is formed at the opening 21b side. The second barrier layer 17b is formed at the conductive layer 18b side.

Since the Cu wire is formed in the opening 21b as with the first barrier layer 16a, a material which reduces Cu diffusion and which has superior adhesion to Cu is used for the first barrier layer 16b. The first barrier layer 16b preferably has a thickness of 3 nm to 10 nm. Incidentally, the first barrier layer 16b may only be formed when it is necessary.

As with the second barrier layer 17a, the second barrier layer 17b is formed between the first barrier layer 16b and the conductive layer 18b. Since the third interlayer insulating layer 14b is formed of SiOC, the fourth interlayer insulating layer 15b is formed of $SiO_2$, and Mn also reacts with Si, the composition of Mn-containing oxides forming the second barrier layer 17b is represented by $Mn_xSi_yO_z$ (x:y:z is in the range of 1:1:3 to 1:3:5). In addition, the second barrier layer 17b preferably has a thickness of 1 nm to 5 nm.

The opening 21c is formed to penetrate the second interlayer insulating layer 13b, the third interlayer insulating layer 14b, and the fourth interlayer insulating layer 15b. Unlike the opening 21b, a conductive material to be filled in the opening 21c is not electrically connected to the first wire 19a. The third wire 19c is formed by burying the conductive layer 18c in the opening 21c. The conductive layer 18c is preferably formed, for example, of copper (Cu).

The dummy plug 20c is formed in a lower part of the opening 21c. The dummy plug 20c has, for example, a cylindrical shape and is formed to have a width smaller than that of the opening 21c. The dummy plug 20c is formed to increase formation areas of the second interlayer insulating layer 13b, the third interlayer insulating layer 14b, the conductive layer 18c, and the second barrier layer 17c. Accordingly, at a portion at which the contact area of the third wire 19c with the second interlayer insulating layer 13b and the third interlayer insulating layer 14b is increased, Mn may be sufficiently consumed by the formation of Mn oxides. Hence, the resistance of the Cu wire may be maintained at a low level.

In addition, although the resistivity of Cu is 1.55 Ω·cm, the resistivity of Mn is 136 Ω·cm. Hence, it is understood that the resistivity of Mn is significantly larger than that of Cu. Accordingly, when Mn is not sufficiently consumed between the third wire 19c and the third and fourth interlayer insulating layers 14b and 15b, and when Mn dissolves in the Cu wire, the resistance of the Cu wire disadvantageously increases.

The first barrier layer 16c and the second barrier layer 17c are sequentially provided between the opening 21c and the conductive layer 18c. The first barrier layer 16c is formed at the opening 21c side. The second barrier layer 17c is formed at the conductive layer 18c side.

Since the Cu wire is formed in the opening 21c, a material which reduces Cu diffusion and which has superior adhesion to Cu is used for the first barrier layer 16c as with the first barrier layer 16b. The first barrier layer 16c preferably has a thickness of 3 nm to 10 nm. Incidentally, the first barrier layer 16c may only be formed when it is necessary.

As with the second barrier layer 17b, the second barrier layer 17c is formed between the first barrier layer 16c and the conductive layer 18c. Since the third interlayer insulating layer 14b is formed of SiOC, the fourth interlayer insulating layer 15b is formed of $SiO_2$, and Mn also reacts with Si, the composition of Mn-containing oxides forming the second barrier layer 17c is represented by $Mn_xSi_yO_z$ (x:y:z is in the range of 1:1:3 to 1:3:5). In addition, the second barrier layer 17c preferably has a thickness of 1 nm to 5 nm.

FIGS. 2A to 5B are views illustrating a method of manufacturing the semiconductor device 50a according to the first embodiment.

FIG. 2A is a view illustrating the state in which a part of the multilayer interconnection structure 40a is formed on the transistor forming layer 60 illustrated in FIG. 1B.

First, on the first interlayer insulating layer 12 (not illustrated in FIG. 2A) of the transistor forming layer 60, the second interlayer insulating layer 13a composed, for example, of SiC having a thickness of 15 nm to 30 nm is formed by a chemical vapor deposition (CVD) method or the like. The first interlayer insulating layer 12 functions as an etching stopper when the openings 21a are formed which will be described later.

Next, the third interlayer insulating layer 14a composed, for example, of SiOC having a thickness of 100 nm to 300 nm is formed on the second interlayer insulating layer 13a. The fourth interlayer insulating layer 15a is formed using a silane gas (such as trimethylsilane), for example, by a plasma chemical vapor deposition (CVD) method. The third interlayer insulating layer 14a is preferably formed, for example, from a low dielectric constant material having a relative dielectric constant of 3.2 or less.

Subsequently, on the third interlayer insulating layer 14a, the fourth interlayer insulating layer 15a is formed, for example, from $SiO_2$ having a thickness of 15 nm to 30 nm. The fourth interlayer insulating layer 15a is formed using a silane gas (such as $SiH_2Cl_2$, $SiH_4$, $Si_2H_4$, or $Si_2H_6$) by a CVD method or the like. The fourth interlayer insulating layer 15a functions as a protective layer for the third interlayer insulating layer 14a having a low CMP resistance.

Next, by a lithography operation and an etching operation, the openings 21a are formed which penetrate the fourth interlayer insulating layer 15a, the third interlayer insulating layer 14a, and the second interlayer insulating layer 13a and which communicate with the wires 10a and 10b (not illustrated in FIG. 2A). The fourth interlayer insulating layer 15a is etched, for example, by a reactive ion etching (RIE) method using a $C_4F_6$/Ar/$O_2$ mixed gas including $C_4F_6$ which is a fluorine-containing gas. The third interlayer insulating layer 14a is etched, for example, by an RIE method. The second interlayer insulating layer 13a is etched, for example, by an RIE method using a $CH_2F_2$/$N_2$/$O_2$ mixed gas including $CH_2F_2$ which is a fluorine-containing gas. For this etching, the chamber temperature is set to room temperature or the like, and the gas flow rates are set, for example, to 10 to 35 sccm for $CH_2F_2$, 50 to 100 sccm for $N_2$, and 15 to 40 sccm for $O_2$.

Subsequently, for example, by a physical vapor deposition (PVD) method, such as a sputtering method, the first barrier layer 16a composed, for example, of Ta having a thickness of 2 nm to 5 nm is formed. Since the Cu wire is formed in the opening 21a, a material which reduces Cu diffusion and which has superior adhesion to Cu is used for the first barrier layer 16a. Incidentally, the first barrier layer 16a may only be formed when it is necessary.

Next, a CuMn alloy layer (not illustrated) composed, for example, of an alloy of Cu and manganese (Mn) having a thickness of 5 nm to 30 nm is formed so as to cover an inside wall of the opening 21a provided with the first barrier layer 16a. The CuMn alloy layer contains 0.2 to 1.0 atomic percent of Mn atoms and preferably contains 0.5 atomic percent or less thereof. Besides the CuMn alloy layer, a layer composed of a mixture containing Mn in Cu may also be used. In addition, when the CuMn alloy layer reacts, the second barrier layer 17a which will be described later is formed, and hence the CuMn alloy layer may not be illustrated in FIG. 2A. However, in a manufacturing process which will be described later, the CuMn alloy layer is illustrated.

Next, in a subsequent operation, by a heat treatment performed after the conductive layer 18a is buried in the opening 21a, before Cu is diffused to the second interlayer insulating layer 13a, the third interlayer insulating layer 14a, and the fourth interlayer insulating layer 15a, which are exposed to the side wall of the opening 21a, Mn is diffused to the second interlayer insulating layer 13a, the third interlayer insulating layer 14a, and the fourth interlayer insulating layer 15a. In addition, since Mn is allowed to react with oxygen contained in the third interlayer insulating layer 14a and the fourth interlayer insulating layer 15a, the second barrier layer 17a composed of Mn-containing oxides is formed.

In the operation described above, although Mn is used as a metal material forming the alloy layer other than Cu, when a metal material is available which has a higher diffusion rate in Cu that that of Cu, and whose oxide has a Cu diffusion-reducing effect and superior adhesion to Cu, the above metal material may also be used as well as Mn. As the metal material described above, for example, besides Mn, niobium (Nb), zirconium (Zr), chromium (Cr), vanadium (V), yttrium (Y), technetium (Tc), or rhenium (Re) may be mentioned.

Since the CuMn alloy layer also functions as a seed layer of electrolytic plating, the thickness thereof is controlled to an appropriate value to form a buried wire in accordance with the wire dimension. In this embodiment, a CuMn alloy layer having a thickness, for example, of 5 nm to 30 nm is formed.

In this operation, the second barrier layer 17a is formed so as to cover the side wall of the opening 21a. However, since Mn in the second barrier layer 17a is diffused by a subsequent heat treatment and is allowed to react with oxygen in the third interlayer insulating layer 14a and the fourth interlayer insulating layer 15a, a CuMn alloy layer including Mn-containing oxides is formed; hence, the CuMn alloy layer covering the inside wall of the opening 21a may not have a uniform thickness.

Next, by an electrolytic plating method, the conductive layer 18a composed of Cu having a thickness of 0.5 μm to 2.0 μm is deposited so as to be buried in the opening 21a. In this embodiment, although the conductive layer 18a composed of Cu is formed, the conductive layer 18a may be an alloy layer composed of Cu and a metal other than Cu, and as the metal other than Cu, a material is used which does not increase the resistance of a wire even when it is contained in Cu.

Subsequently, a heat treatment is performed at 100 to 250° C. for 1 to 60 minutes. By this heat treatment, Mn is diffused from the CuMn alloy layer and is allowed to react with oxygen contained in the third interlayer insulating layer 14a and the fourth interlayer insulating layer 15a exposed to the side wall of the opening 21a. In addition, the second barrier layer 17a composed of Mn-containing oxides is formed to have a thickness of 1 nm to 5 nm on the side wall of the opening 21a provided with the first barrier layer 16a.

Next, for example, by a CMP method, the first barrier layer 16a, the second barrier layer 17a, and the conductive layer 18a are partly removed approximately to the middle of the fourth interlayer insulating layer 15a by polishing, so that the first wire 19a composed of Cu is formed in the opening 21a.

Figure 2B:
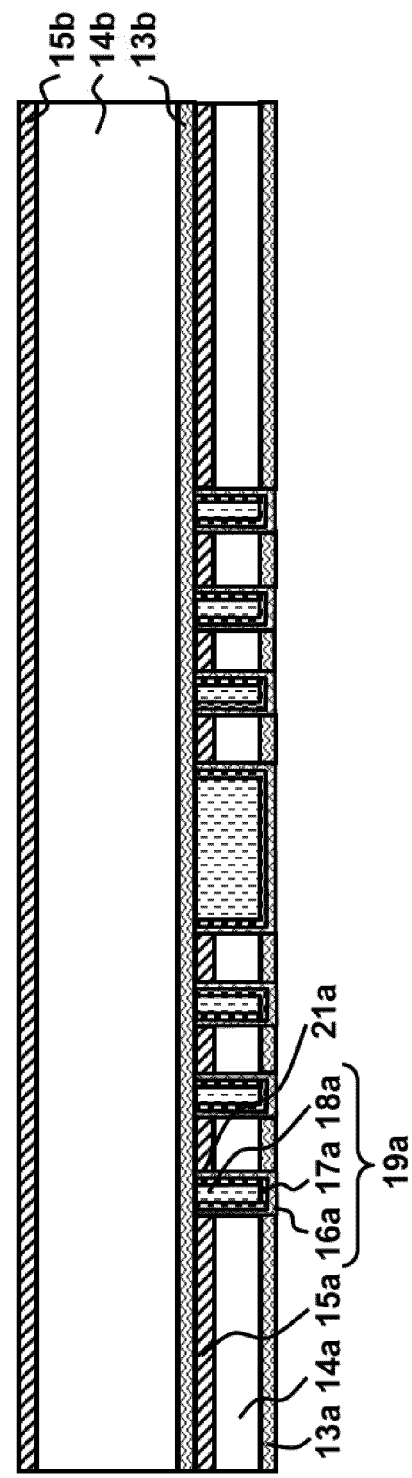

FIG. 2B is a view illustrating the state in which the second interlayer insulating layer 13b, the third interlayer insulating layer 14b, and the fourth interlayer insulating layer 15b are sequentially formed in that order on the fourth interlayer insulating layer 15a.

First, as in the case illustrated in FIG. 2A, the second interlayer insulating layer 13b composed, for example, of SiC having a thickness of 15 nm to 30 nm is formed on the fourth interlayer insulating layer 15a (not illustrated in the figure) by a CVD method or the like. The fourth interlayer insulating layer 15a functions as an etching stopper when the openings 21b and 21c are formed which will be described later.

Subsequently, as in the case illustrated in FIG. 2A, the third interlayer insulating layer 14b composed, for example, of SiOC having a thickness of 100 nm to 300 nm is formed on the second interlayer insulating layer 13b by a plasma CVD method or the like.

Next, the fourth interlayer insulating layer 15b composed, for example, of $SiO_2$ having a thickness of 15 nm to 30 nm is formed on the third interlayer insulating layer 14b by a CVD method or the like.

Figure 3A:
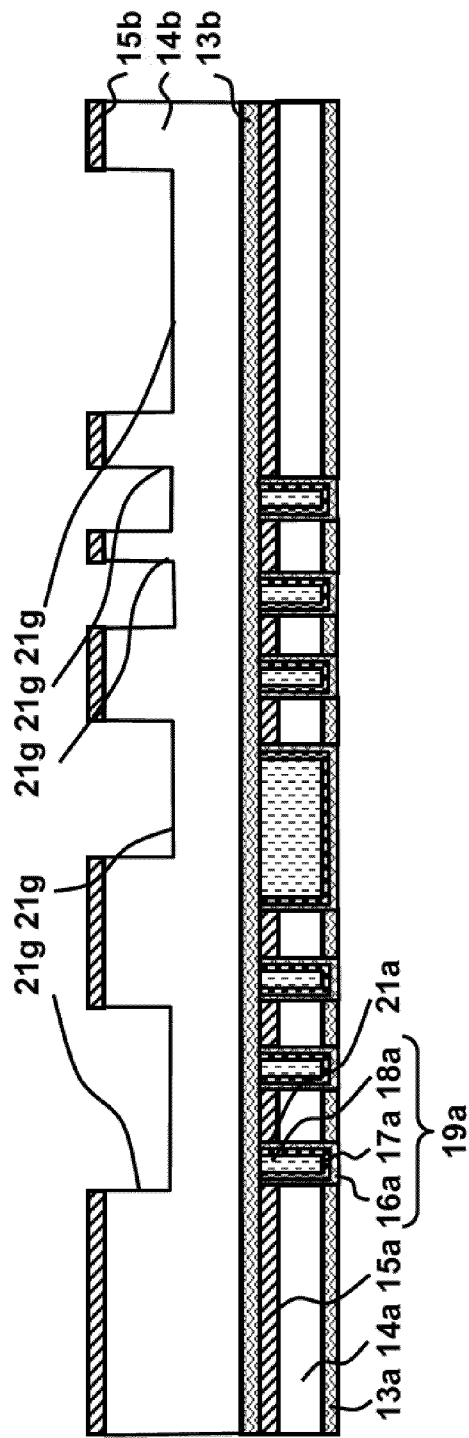
FIGS. 3A-3B are views each illustrating the method of manufacturing the semiconductor device 50a according to the first embodiment.

FIG. 3A is a view illustrating the state in which openings 21g are formed by a lithography operation and an etching operation which penetrate the fourth interlayer insulating layer 15b and which each have a grooved shape in the third interlayer insulating layer 14b.

As in the case illustrated in FIG. 2A, the fourth interlayer insulating layer 15b is etched, for example, by an RIE method using a $C_4F_6/Ar/O_2$ mixed gas including $C_4F_6$ which is a fluorine-containing gas.

As in the case illustrated in FIG. 2A, the third interlayer insulating layer 14b is etched, for example, by an RIE method. By these etching operations, the openings 21g are formed which penetrate the fourth interlayer insulating layer 15b and which each have a grooved shape in the third interlayer insulating layer 14b.

Figure 3B:
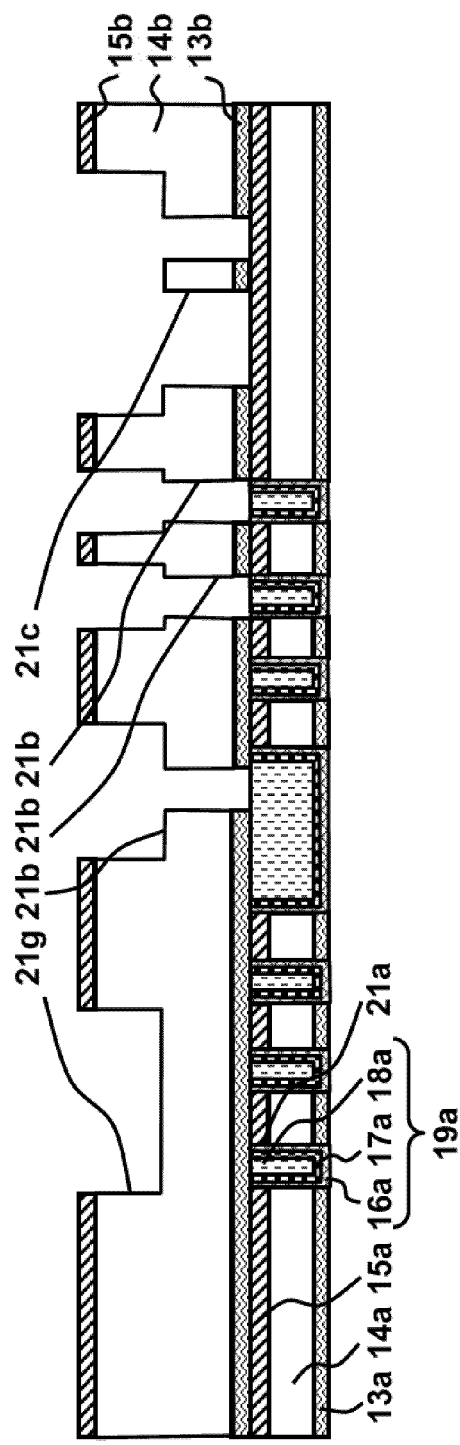

FIG. 3B is a view illustrating the state in which the openings 21b and 21c are formed by a lithography operation and an etching operation which penetrate the fourth interlayer insulating layer 15b and which each have a via shape in the third interlayer insulating layer 14b.

As in the case illustrated in FIG. 2A, the fourth interlayer insulating layer 15b is etched, for example, by an RIE method using a $C_4F_6/Ar/O_2$ mixed gas including $C_4F_6$ which is a fluorine-containing gas.

As in the case illustrated in FIG. 2A, the third interlayer insulating layer 14b is etched, for example, by an RIE method. By this etching operation, the third interlayer insulating layer 14b located under the openings 21g is etched. By this etching operation, the second interlayer insulating layer 13b is exposed at the bottom of the openings 21b and 21c.

The second interlayer insulating layer 13b is etched, for example, by an RIE method using a $CH_2F_2/N_2/O_2$ mixed gas including $CH_2F_2$ which is a fluorine-containing gas. For this etching, the chamber temperature is set to room temperature or the like, and the gas flow rates are set, for example, to 10 to 35 sccm for $CH_2F_2$, 50 to 100 sccm for $N_2$, and 15 to 40 sccm for $O_2$. By this etching operation, the via-shaped openings 21b and 21c are formed in the third interlayer insulating layer 14b and the second interlayer insulating layer 13b.

The opening 21b is formed so that a conductive material to be filled in the opening 21b is electrically connected to the first wire 19a. On the other hand, the opening 21c is formed on the fourth interlayer insulating layer 15a under which the first wire 19a is not provided. That is, in the opening 21c, the third wire 19c is formed which will be described later. The width of the via shape is not particularly limited. Since it is intended to increase the surface area of the opening, a width smaller than that of the opening 21g is preferable.

Figure 4A:
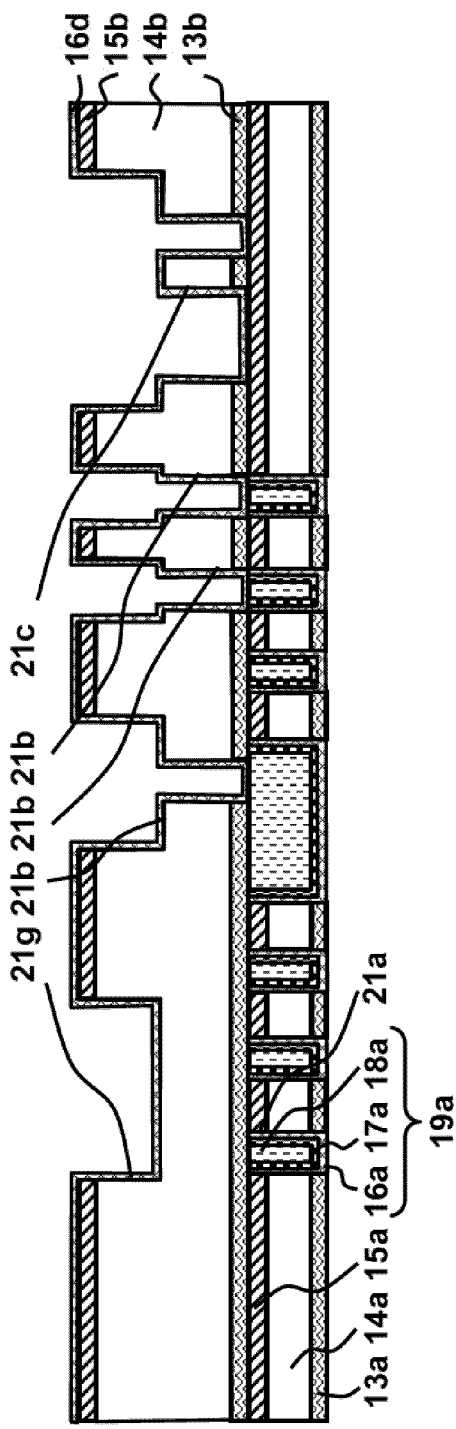
FIGS. 4A-4B are views each illustrating the method of manufacturing the semiconductor device 50a according to the first embodiment.

FIG. 4A is a view illustrating the state in which a first barrier layer 16d composed, for example, of Ta having a thickness of 3 nm to 10 nm is formed, for example, by a PVD method, such as a sputtering method, so as to cover the openings 21g, 21b, and 21c, and the fourth interlayer insulating layer 15b. Since the Cu wire is formed in the openings 21g, 21b, and 21c, as in the case of the first barrier layer 16a, a material which reduces Cu diffusion and which has superior adhesion to Cu is used for the first barrier layer 16d. Incidentally, the first barrier layer 16d may only be formed when it is necessary.

Figure 4B:
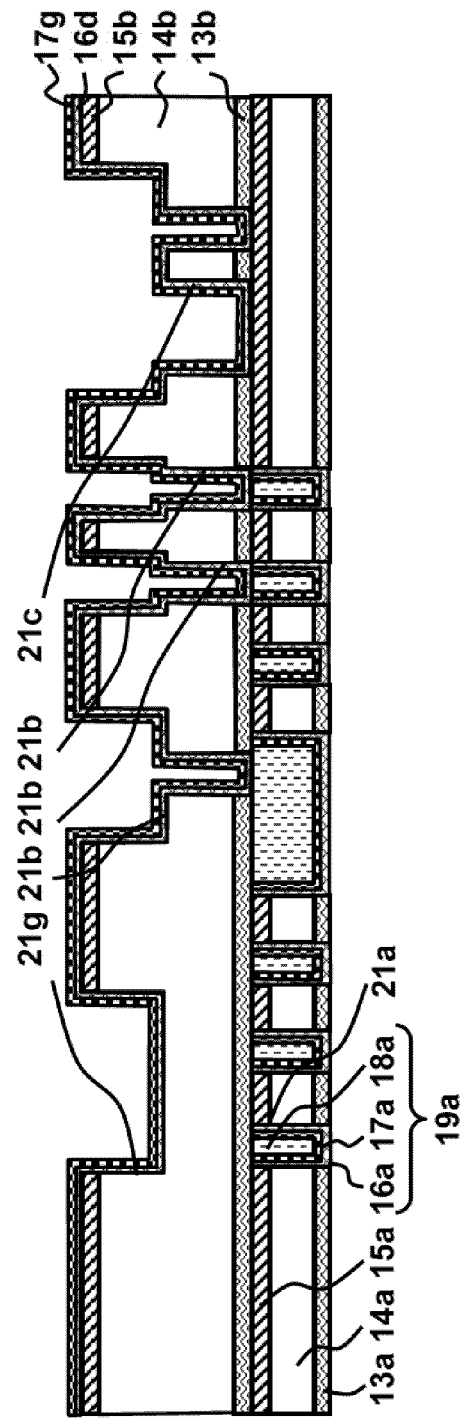

FIG. 4B is a view illustrating the state in which while the first barrier layer 16d covers inside walls of the openings 21g, 21b, and 21c, a CuMn alloy layer 17g composed, for example, of an alloy of Cu and manganese (Mn) having a thickness of 5 nm to 30 nm is formed. Since the CuMn alloy layer 17g also functions as a seed layer of electrolytic plating which will be described later, the thickness thereof is controlled to an appropriate value to form a buried wire in accordance with the wire dimension. In this embodiment, a CuMn alloy layer having a thickness of 5 nm to 30 nm is formed. The CuMn alloy layer contains 0.2 to 1.0 atomic percent of Mn atoms and preferably contains 0.5 atomic percent or less. In addition, as the CuMn alloy layer 17g, a layer composed of a mixture including Cu and Mn may also be used as well as the alloy.

In addition, since the surface area of the CuMn alloy layer 17g is increased by the presence of the openings 21g, 21b, and 21c, the CuMn alloy layer 17g formed to cover the openings 21g, 21b, and 21c has a small thickness as compared to that of the CuMn alloy layer which is formed to cover the openings 21a by a sputtering method.

In this operation, the second barrier layer 17a is formed so as to cover the side walls of the openings 21g, 21b, and 21c. However, in a subsequent operation, since Mn in the second barrier layer 17a is diffused by a heat treatment and is allowed to react with oxygen in the third interlayer insulating layer 14b and the fourth interlayer insulating layer 15b, a CuMn alloy layer including Mn-containing oxides is formed; hence the CuMn alloy layer covering the inside walls of the openings 21g, 21b, and 21c may not have a uniform thickness.

In addition, since the opening 21c is formed, the CuMn alloy layer 17g may be formed to have a small thickness as compared to that obtained when the opening 21c is not formed, that is, when the surface area of the opening is not increased. The total amount of the CuMn alloy layer sputtered on the inside walls of the openings 21g, 21b, and 21c is constant in one sputtering operation. Hence, when the surface area, that is, sputtered area, is large, the thickness of the CuMn alloy layer 17g formed by sputtering may be decreased.

FIG. 5A is a view illustrating the state in which a conductive layer 18d composed of Cu having a thickness of 0.5 µm to 2.0 µm is deposited by an electrolytic plating method so as to be buried in the openings 21g, 21b, and 21c. In this embodiment, the conductive layer 18d composed of Cu is formed; however, the conductive layer 18d may be an alloy layer including Cu and a metal other than Cu, and as the metal other than Cu, a material is used which does not increase the resistance of a wire even when it is contained in Cu.

Next, a heat treatment is performed at 100 to 250° C. for 1 to 60 minutes. By the heat treatment performed after the conductive layer 18d is buried in the openings 21g, 21b, and 21c, before Cu is diffused to the second interlayer insulating layer 13b, the third interlayer insulating layer 14b, and the fourth interlayer insulating layer 15b exposed to the side walls of the openings 21g, 21b, and 21c, Mn is diffused to the second interlayer insulating layer 13b, the third interlayer insulating layer 14b, and the fourth interlayer insulating layer 15b. Subsequently, Mn is allowed to react with oxygen in the third interlayer insulating layer 14b and the fourth interlayer insulating layer 15b, and a second barrier layer 17h composed of Mn-containing oxides is formed.

In addition, by this heat treatment, Mn is diffused from the CuMn alloy layer 17g and is allowed to react with oxygen in the third interlayer insulating layer 14b and the fourth interlayer insulating layer 15b exposed to the side walls of the openings 21g, 21b, and 21c. Subsequently, the second barrier layer 17h composed of Mn-containing oxides is formed on the side walls of the openings 21g, 21b, and 21c each provided with the first barrier layer 16d to have a thickness of 1 nm to 5 nm. In this embodiment, since the third interlayer insulating layer 14b is formed of SiOC, the fourth interlayer insulating layer 15b is formed of $SiO_2$, and Mn also reacts with Si, the composition of the Mn-containing oxides forming the second barrier layer 17h is represented by $Mn_xSi_yO_z$ (x:y:z is 1:1:3 to 1:3:5).

In this case, since the CuMn alloy layer 17g having a small thickness is formed as described above, the ratio of Mn of the CuMn alloy layer 17g forming the second barrier layer 17h on the side walls of the openings 21g, 21b, and 21c is large than that of Mn dissolved in Cu. Hence, an increase in resistance of the Cu wire caused by dissolution of Mn in the conductive layer 18d may be suppressed.

FIG. 5B is a view illustrating the case in which, for example, by a CMP method, the first barrier layer 16d, the second barrier layer 17h, and the conductive layer 18d are partly removed approximately to the middle of the fourth interlayer insulating layer 15b by polishing, so that the second wire 19b composed of Cu is formed in the opening 21b, and the third wire 19c composed of Cu is formed in the opening 21c. The operations described above with reference to FIGS. 2B to 5B are repeatedly performed, so that the semiconductor device 50a including the multilayer interconnection structure 40a is formed.

According to the semiconductor device 50a of the first embodiment, the contact area between the insulating layers containing oxygen and the second barrier layer containing Mn may be increased. Hence, Mn may be sufficiently consumed by the formation of Mn oxides at a portion at which the contact area between the insulating layers and the second barrier layer is increased. As a result, an increase in resistance of the copper wire may be reduced.

Figures 6A, 6B:
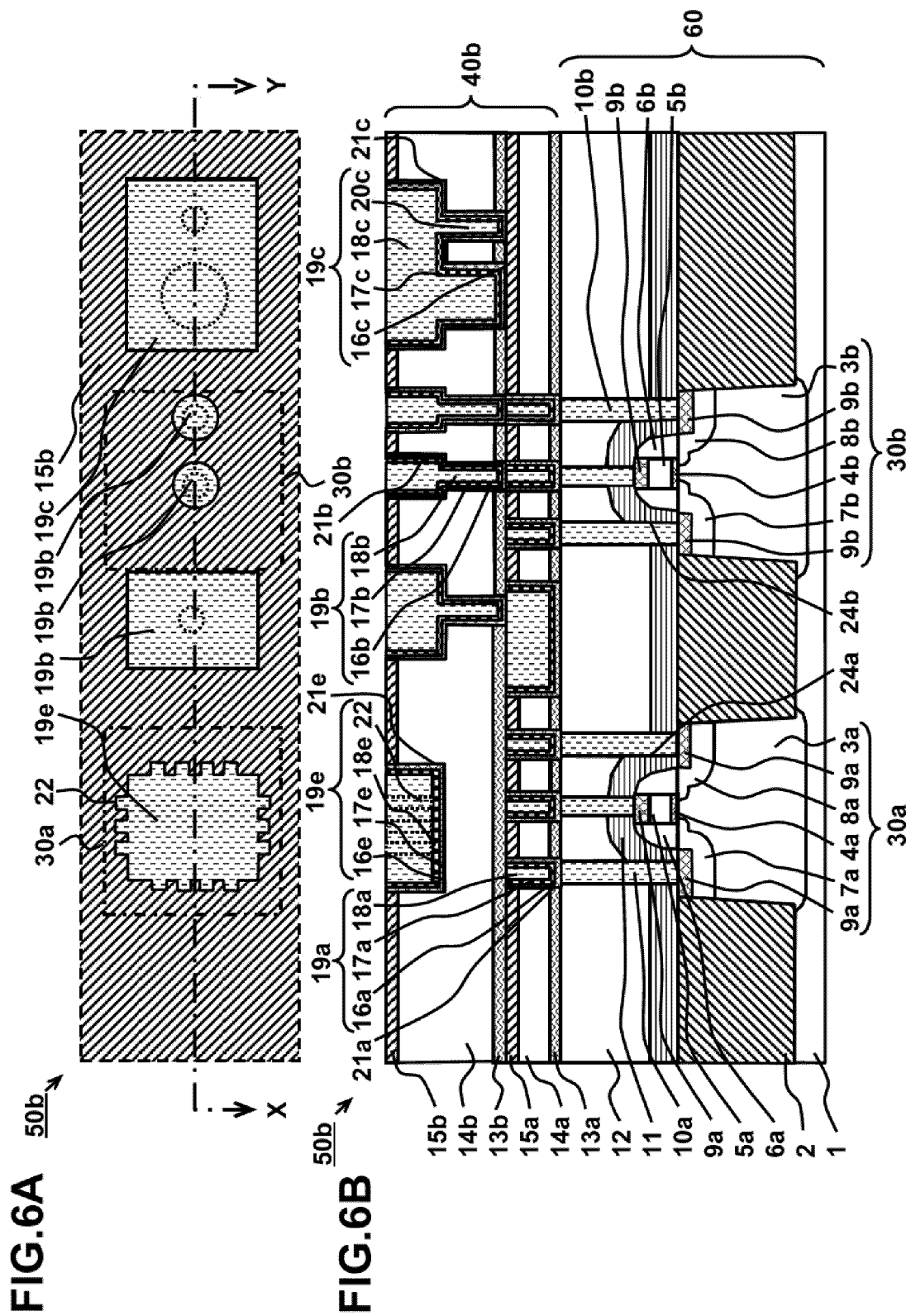
FIG. 6A is a plan view illustrating the structure of a semiconductor device 50b according to a second embodiment.
FIG. 6B is a cross-sectional view of the semiconductor device 50b taken along the line X-Y illustrated in FIG. 6A.

In the second embodiment, FIGS. 6A and 6B are views each illustrating the structure of a semiconductor device 50b having a multilayer interconnection structure 40b. In the second embodiment, constituents similar to those described in the first embodiment will be designated by the same reference numerals, and a description thereof will be omitted.

FIGS. 6A and 6B each illustrate the structure of the semiconductor device 50b of the second embodiment. FIG. 6A is a plan view of the semiconductor device 50b. FIG. 6B is a cross-sectional view taken along the line X-Y illustrated in FIG. 6A.

As illustrated in FIG. 6A, in the semiconductor device 50b of the second embodiment, reference numeral 15b indicates a fourth interlayer insulating layer, reference numeral 19b indicates a second wire (Cu wire), reference numeral 19c indicates a third wire, and reference numeral 19e indicates a fourth wire.

The fourth wire 19e has a concavo-convex portion 22 in a plane direction of a Cu wire. The concavo-convex portion 22 is formed to increase the surface area of the fourth wire 19e and that of the Cu wire.

As illustrated in FIG. 6B, the semiconductor device 50b of the second embodiment has a transistor forming layer 60 and the multilayer interconnection structure 40b. The multilayer interconnection structure 40b has first wires 19a, the second wires 19b, the third wire 19c, and the fourth wire 19e. Constituents illustrated in FIG. 6B similar to those described with reference to FIG. 6A are designated by the same reference numerals.

The fourth wire 19e is formed by burying a conductive layer 18e in an opening 21e. The opening 21e is formed by opening a third interlayer insulating layer 14b and the fourth interlayer insulating layer 15b. The opening 21e is formed so that a conductive material to be filled therein is not electrically connected to the first wire 19a. The conductive layer 18e is preferably formed, for example, of copper (Cu).

The concavo-convex portion 22 is formed along the periphery of the opening 21e. The concavo-convex portion 22 is formed to have an X-Y direction width smaller than the width of the opening 21e in the X-Y direction. The concavo-convex portion 22 is formed to increase a contact area between insulating layers containing oxygen and a second barrier layer 17e which will be described below. Hence, as in the first embodiment, Mn may be sufficiently consumed by the formation of Mn oxides at a portion at which the contact area of the second barrier layer 17e with the third interlayer insulating layer 14b and the fourth interlayer insulating layer 15b is increased. Accordingly, the resistance of the Cu wire may be maintained at a low level.

A first barrier layer 16e and the second barrier layer 17e are sequentially formed between the opening 21e and the conductive layer 18e. The first barrier layer 16e is formed at the opening 21e side. The second barrier layer 17e is formed at the conductive layer 18e side.

Since the Cu wire is formed in the opening 21e, a material which reduces Cu diffusion and which has superior adhesion to Cu is used for the first barrier layer 16e. The first barrier layer 16e preferably has a thickness of 3 nm to 10 nm. Incidentally, the first barrier layer 16e may only be formed when it is necessary.

The second barrier layer 17e is formed between the first barrier layer 16e and the conductive layer 18e. Since the third interlayer insulating layer 14b is formed of SiOC, the fourth interlayer insulating layer 15b is formed of $SiO_2$, and Mn also reacts with Si, the composition of Mn-containing oxides forming the second barrier layer 17e is represented by $Mn_xSi_yO_z$ (x:y:z is 1:1:3 to 1:3:5). In addition, the second barrier layer 17e preferably has a thickness of 1 nm to 5 nm.

According to the structure of the semiconductor device 50b of the second embodiment, besides the structure of the semiconductor device 50a of the first embodiment, the fourth wire 19e having a concavo-convex portion in a plane direction of the Cu wire is formed. Hence, even in the case in which a dummy plug may not be formed under the Cu wire, the contact area between the interlayer insulating layers and the second barrier layer containing Mn may be increased. Accordingly, Mn may be sufficiently consumed by the formation of Mn oxides at a portion at which the contact area of the second barrier layer with the insulating layers is increased. As a result, the resistance of the Cu wire may be maintained at a low level.

In the third embodiment, FIGS. 7A and 7B are views each illustrating the structure of a semiconductor device 50c having a multilayer interconnection structure 40c. In the third embodiment, constituents similar to those described in the first embodiment will be designated by the same reference numerals, and a description thereof will be omitted.

FIGS. 7A and 7B each illustrate the structure of the semiconductor device 50c of the third embodiment. FIG. 7A is a plan view of the semiconductor device 50c. FIG. 7B is a cross-sectional view taken along the line X-Y illustrated in FIG. 7A.

As illustrated in FIG. 7A, in the semiconductor device 50c of the third embodiment, reference numeral 15b indicates a fourth interlayer insulating layer, reference numeral 19b indicates a second wire (Cu wire), reference numeral 19c indicates a third wire, and reference numeral 19f indicates a fifth wire.

Slit portions 23 are formed inside the fifth wire 19f. The slit portions 23 are formed, for example, of an insulating material such as $SiO_2$.

However, when the slit portions 23 are formed, since the cross-sectional area of the wire is decreased, an increase in wiring resistance unfavorably occurs. Hence, the rate of decrease in cross-sectional area caused by the formation of the slit portions 23 may be set lower than the rate of increase in resistance caused by Mn intrusion. The slit portions 23 are formed to increase the surface area between the insulating layer containing oxygen and a second barrier layer, which will be described later, in the fifth wire 19f. For example, the slit portions 23 are preferably formed so as to decrease a 1 μm-wide fifth wire 19f by approximately 2.5% and so as to decrease a 3 μm-wide fifth wire 19f by approximately 5%. In addition, the surfaces of the slit portions 23 may be formed inside the fifth wire 19f. That is, the slit portions 23 may have a grooved shape formed inside the fifth wire 19f.

As illustrated in FIG. 7B, the semiconductor device 50c of the third embodiment has a transistor forming layer 60 and the multilayer interconnection structure 40c. The multilayer interconnection structure 40c has first wires 19a, the second wires 19b, the third wire 19c, and the fifth wire 19f. In this embodiment, constituents illustrated in FIG. 7B similar to those described with reference to FIG. 7A are designated by the same reference numerals.

The fifth wire 19f is formed by burying a conductive layer 18f in an opening 21f. The opening 21f is formed by opening a third interlayer insulating layer 14b and a fourth interlayer insulating layer 15b. A conductive material to be filled in the opening 21f is not electrically connected to the first wire 19a. The conductive layer 18f is preferably formed, for example, of copper (Cu).

In the fifth wire 19f, the slit portions 23 are formed. The slit portions 23 are formed of an insulating material containing oxygen, such as $SiO_2$.

However, when the slit portions 23 are formed, since the cross-sectional area of the wire is decreased, an increase in wire resistance unfavorably occurs. Hence, the rate of decrease in cross-sectional area caused by the formation of the slit portions 23 may be set lower than the rate of increase in resistance caused by Mn intrusion. The slit portions 23 are formed to increase the surface area between the insulating material containing oxygen and a second barrier layer 17f, which will be described below, in the fifth wire 19f. For example, the slit portions 23 are preferably formed so as to a decrease a 1 μm-wide fifth wire 19f by approximately 2.5% and so as to decrease a 3 μm-wide fifth wire 19f by approximately 5%.

A first barrier layer 16f and the second barrier layer 17f are sequentially formed between the opening 21f and the conductive layer 18f. The first barrier layer 16f is formed at the opening 21f side. The second barrier layer 17f is formed at the conductive layer 18f side.

Since the Cu wire is formed in the opening 21f, a material which reduces Cu diffusion and which has superior adhesion to Cu is used for the first barrier layer 16f. The first barrier layer 16f preferably has a thickness of 3 nm to 10 nm. Incidentally, the first barrier layer 16f may only be formed when it is necessary.

The second barrier layer 17f is formed between the first barrier layer 16f and the conductive layer 18f. Since the third interlayer insulating layer 14b is formed of SiOC, the fourth interlayer insulating layer 15b is formed of $SiO_2$, and Mn also reacts with Si, the composition of Mn-containing oxides forming the second barrier layer 17f is represented by $Mn_xSi_yO_z$ (x:y:z is in the range of 1:1:3 to 1:3:5). In addition, the second barrier layer 17f preferably has a thickness of 1 nm to 5 nm.

According to the structure of the semiconductor device 50c of the third embodiment, besides the structure of the semiconductor device 50a of the first embodiment, the slit portions 23 are formed. Hence, even when a dummy plug may not be formed under the Cu wire, the contact area between the second barrier layer containing Mn and the insulating material containing oxygen may be increased. Accordingly, Mn may be sufficiently consumed by the formation of Mn oxides at a portion at which the contact area of the second barrier layer with the insulating material is increased. As a result, the resistance of the Cu wire may be maintained at a low level.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiment(s) of the present invention has (have) been described in detail, it should be understood that the various changes, substitutions, and alterations could be made hereto without departing from the spirit and scope of the invention.

What is claimed is:

1. A semiconductor device comprising:
a first insulating layer formed over a semiconductor substrate, the first insulating layer including oxygen;
a first wire formed in the first insulating layer;
an interlayer insulating layer formed on the first insulating layer;
a second insulating layer formed over the interlayer insulating layer;
a second wire formed in the second insulating layer over the first wire, the second wire including a first upper plug and a first lower plug whose width is smaller than a width of the first upper plug, the first upper plug and the first lower plug formed in the second insulating layer, the first lower plug being in contact with the first wire through an upper surface in the interlayer insulating layer, and the second wire containing manganese, oxygen, and copper; and a third wire formed in the second insulating layer, the third wire including a second upper plug and a second lower plug whose width is smaller than a width of the second upper plug, the second upper plug and the second lower plug formed in the second insulating layer, extending downwardly and spaced apart from the first wire, and a bottom of the second lower plug is in contact with the interlayer insulating layer.

2. The semiconductor device according to claim 1, wherein the second lower plug has at least one of a cylindrical shape and a grooved shape.

3. The semiconductor device according to claim 1, wherein the third wire includes a third upper plug and a third lower plug whose width is smaller than a width of the third upper plug.

* * * * *